United States Patent
Horos

(10) Patent No.: US 6,363,343 B1
(45) Date of Patent: Mar. 26, 2002

(54) AUTOMATIC GAIN CONTROL

(75) Inventor: Jacek Andrzej Horos, Hampshire (GB)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/184,721

(22) Filed: Nov. 2, 1998

(30) Foreign Application Priority Data

Nov. 4, 1997 (GB) ............................................... 9723240

(51) Int. Cl.⁷ .................. G10L 21/02; G10L 15/20; H04B 17/02; H04B 14/06; G01S 7/34
(52) U.S. Cl. .................. 704/225; 704/201; 704/231; 455/136; 455/138; 375/251; 367/65; 235/462.26; 342/92
(58) Field of Search ............................... 704/201–228; 381/72, 108, 106; 327/309–311, 552–558; 330/279; 375/25; 455/13; 367/65; 342/92

(56) References Cited

U.S. PATENT DOCUMENTS

| | | | |
|---|---|---|---|
| 4,461,025 A | 7/1984 | Franklin | 381/56 |
| 4,514,703 A | 4/1985 | Maher et al. | 330/279 |
| 4,975,657 A * | 12/1990 | Eastmond | 330/279 |
| 5,146,504 A * | 9/1992 | Pinckley | 704/225 |
| 5,293,139 A | 3/1994 | Polonen et al. | 333/14 |
| 5,350,956 A | 9/1994 | Gronroos | 307/556 |
| 5,530,767 A | 6/1996 | Yoshida | 381/72 |
| 5,544,250 A * | 8/1996 | Urbanski | 204/226 |
| 5,592,545 A | 1/1997 | Ho et al. | 379/347 |
| 5,867,574 A * | 2/1999 | Eryilmaz | 704/201 |
| 5,896,449 A * | 4/1999 | Oshidari et al. | 704/201 |
| 6,094,481 A | 7/2000 | Deville et al. | 379/390 |

FOREIGN PATENT DOCUMENTS

| | | |
|---|---|---|
| EP | 0 175 375 A2 | 3/1986 |
| EP | 0175375 A2 | 3/1986 |
| EP | 0836310 A1 | 4/1998 |
| GB | 2 293 520 A | 3/1996 |
| JP | 0 175 375 * 9/1985 | ............ H04M/1/10 |
| WO | WO 98/08324 | 2/1998 |

* cited by examiner

Primary Examiner—Richemond Dorvil
Assistant Examiner—Daniel A Nolan
(74) Attorney, Agent, or Firm—Perman & Green, LLP

(57) ABSTRACT

A gain control circuit for a telephone, the circuit comprising a signal strength calculator for calculating the strength of a signal; a gain controller adapted to modify the strength of the signal in accordance with a predetermined criterion based on the strength of the signal calculated by the signal strength calculator.

8 Claims, 3 Drawing Sheets

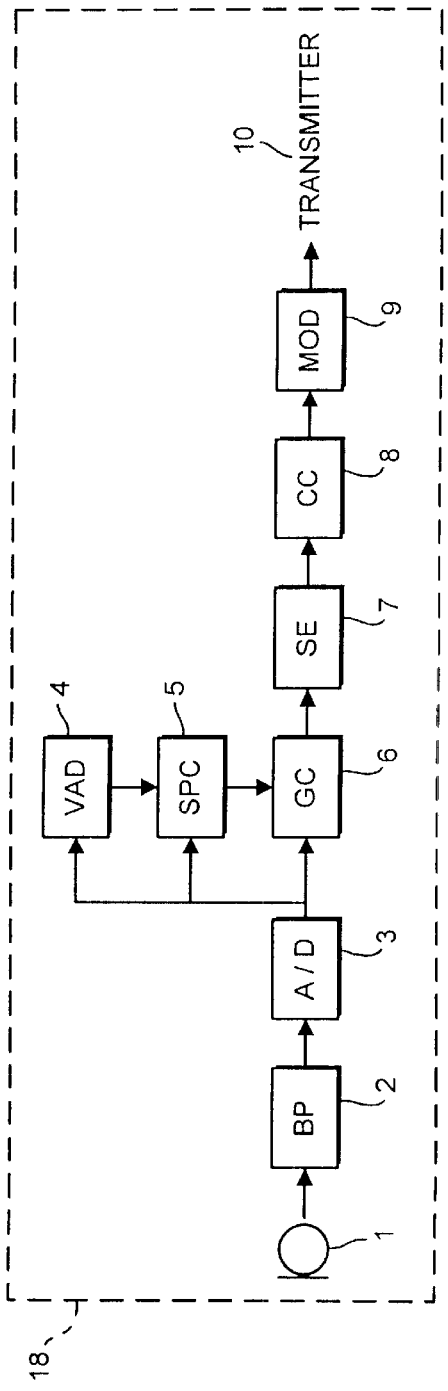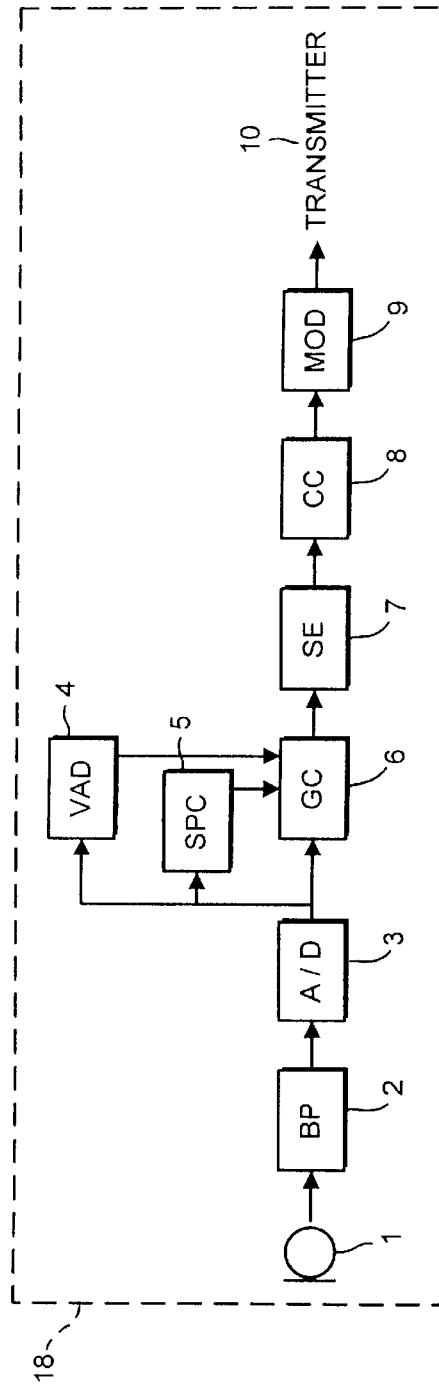

AUTOMATIC GAIN CONTROL

FIELD OF THE INVENTION

This invention relates to a gain control circuit in particular, but not exclusively, for a telephone.

DESCRIPTION OF THE PRIOR ART

When a user of a telephone speaks into the microphone, the microphone converts the sound into either an analogue or digital electric signal which is then amplified and processed before the signal is transmitted onto the telecommunications network, which may be a wired or wireless system.

Typically the amplification of the voice signal is fixed and set at a level suitable for volumes used in normal conversation. Unfortunately, if a user, say the calling party, wants to lower the volume of their voice, for example when privacy is required from people nearby or the user wants to minimise the disturbance to other people, the called party may have difficulty in hearing the calling party. One solution to this problem has been to incorporate into the phone a 'whisper' mode which is selected by the user when required. When in this mode the gain of the voice signal is increased by a fixed amount. This solution enables the called party to hear quiet conversation as if the caller was talking at normal volume. This solution works well when the caller is talking quietly, however if the caller starts to talk at normal volume while the 'whisper' mode is still active the called party may be deafened and/or acoustic coupling between the microphone and speaker may take place.

SUMMARY OF THE INVENTION

In accordance with one aspect of the present invention, there is provided a gain control circuit for a telephone, the circuit comprising a signal strength calculator for calculating the strength of a signal; and a gain controller adapted to modify the strength of the signal in accordance with a predetermined criterion based on the strength of the signal calculated by the signal strength calculator.

In the present invention the gain applied to the signal, typically a speech signal, increases as the strength of the signal decreases. This automatically compensates for the strength of the input signal. Therefore, if a user wishes to lower the volume of their voice the called party will still hear the speakers voice without any appreciable change in volume.

Preferably the circuit further comprising a speech activity detector for determining the presence and/or absence of speech, wherein the gain controller sets the gain applied to the signal to a predetermined level based on whether presence and/or absence of speech in the signal is detected.

Preferably the speech activity detector is coupled to the gain controller.

More preferably the speech activity detector is coupled to the signal power calculator.

Typically the gain controller sets the gain applied to the signal to the predetermined level based on whether the level of speech in the signal falls below a predetermined threshold as calculated by the speech activity detector.

Typically the predetermined level is the last gain value set by the gain controller before the speech level fell below the predetermined threshold.

Preferably the predetermined criterion is that the gain applied to the signal varies substantially linearly in relation to a change in the signal strength.

According to a second aspect of the present invention, we provide a method of controlling the gain of a telephone audio signal wherein the strength of the audio signal is varied in accordance with a predetermined criterion based on the strength of the audio signal.

Preferably the strength of the audio signal is set to a predetermined level when the level of speech falls below a predetermined threshold.

BRIEF DESCRIPTION OF THE DRAWINGS

Examples of apparatus and methods of operating the apparatus in accordance with the invention will now be described with reference to the accompanying drawings, in which:

FIG. 1 is a schematic block diagram of one embodiment of the automatic gain control apparatus;

FIG. 2 is a schematic block diagram of a second embodiment of the automatic gain control apparatus;

DESCRIPTION OF THE EMBODIMENTS

Figure 3:
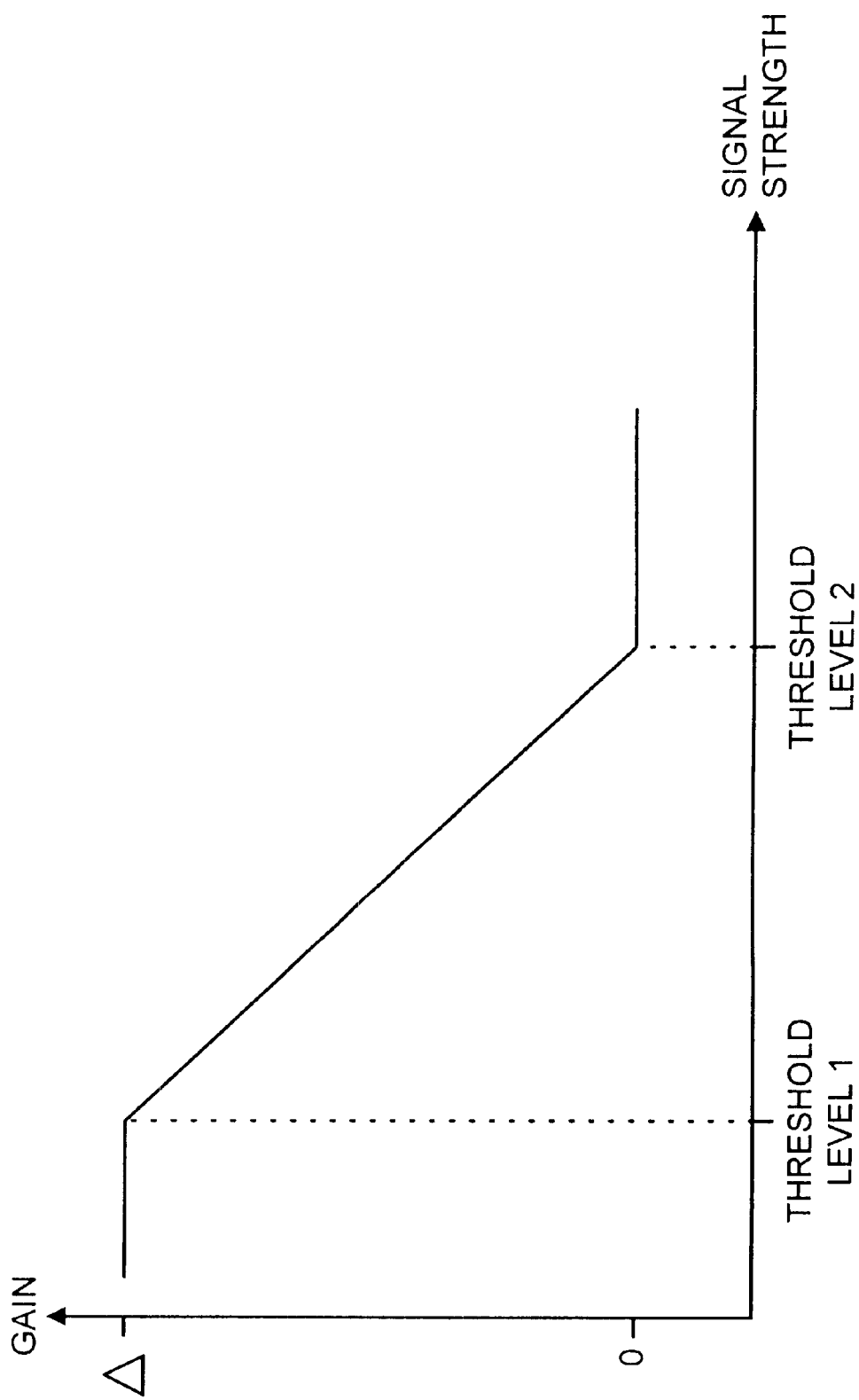
FIG. 3 illustrates an example of a gain control vs signal strength relationship for the present invention.

This invention is applicable to both digital and analogue telephones in a wired or wireless telecommunications system. This specific embodiment, however, is directed to automatic gain control circuitry in a digital radio telephone.

FIG. 1 illustrates an example of an automatic gain control circuit in the transmitting section of a mobile phone 18. A microphone 1 is coupled to a bandpass filter 2 which is coupled to an analogue to digital converter 3. The analogue to digital converter 3 is coupled to an activity detector 4 which will typically be a voice or speech activity detector, a signal power calculator 5 and a gain controller 6. The speech activity detector 4 is coupled to the signal power calculator 5 which is coupled to the gain controller 6. The gain controller 6 is coupled to a speech encoder 7 which is coupled to a channel coder 8. The channel coder 8 is coupled to a modulator 9 which is coupled to a transmitter 10. The automatic gain control circuit comprises the gain controller 6, the signal power calculator 5 and the speech activity detector 4.

The operation of the transmit section shown in FIG. 1 will now be described.

As a user speaks into the telephone microphone 1, the microphone 1 converts the sounds into an electrical signal. This signal is passed to the bandpass filter 2. As typically baseband speech signals in telephony are restricted to a bandwidth of 300 Hz to 3.4 kHz the bandpass filter 2 is typically selected to remove frequency components above 4 kHz however other bandpass filters may be used. This is to prevent aliasing problems. The filtered signal is passed to the analogue to digital converter 3 which samples and digitises the analogue signal. The signal is then passed to the speech activity detector 4, the signal power calculator 5 and the gain controller 6.

By analysing the digitised signal the speech activity detector 4 determines whether or not speech is present in the signal. The results of this analysis is passed to the signal power calculator 5. The signal power calculator 5 analyses the received digitised signal and calculates the power of this signal. Based on a predetermined criterion or algorithm the signal power calculator 5 calculates, based on the power of the signal, the gain that should be applied to this signal. FIG. 3 shows a typical gain vs signal power algorithm, however, any algorithm which varies gain in relation to signal strength may be selected.

While speech is being detected, or the speech level is above a predetermined threshold, the calculated gain value is passed to the gain controller 6 which modifies the gain of the signal accordingly. If the speech activity detector 4 does not detect speech, or the speech level is below a predetermined threshold, the speech activity detector 4 informs the signal power calculator 5 and the signal power calculator 5 does not update the gain controller 6 with a new gain value. Optionally the signal power calculator 6 may instruct the gain controller 6 to change the gain to another predetermined value, for example set the gain to zero. The use of the speech activity detector 4 is not necessary, however, without the detector it is possible, in the absence of speech, that maximum gain will be applied to the background noise. This can be disconcerting to the user. However, it is preferable to have a certain amount of noise in the signal even when no speech is present, otherwise the telephone may appear dead and can disrupt the conversation. This noise is typically called 'comfort noise' and gives the system 'presence'.

Once the gain of the signal has been set by the gain controller 6 the signal is passed to the speech encoder 7 which compresses the signal. The compressed signal is then passed to the channel coder 8 which adds extra bits to the digitised signal to protect from errors introduced during transmission. The signal is then passed to the modulator 9 which modulates the signal onto a carrier signal and passes the signal to the transmitter 10 for transmission over the network.

An alternative embodiment is shown in FIG. 2. In this embodiment the speech activity detector 4 is directly coupled to the gain controller 6. In this embodiment the speech signal is passed from the microphone 1 to the speech activity detector 4, the signal power converter 5 and the gain controller as in the previous embodiment shown in FIG. 1. The speech activity detector 4 indicates to the gain controller whether or not the signal contains speech or whether the speech level is above or below a threshold. If the speech activity detector 4 indicates to the gain controller 6 that speech is contained in the signal the gain controller 6 adjusts the gain of the signal in accordance with instruction received from the signal power calculator 5. While the speech activity detector 4 indicates to the gain controller 6 that speech is not contained in the signal, the gain controller 6 will ignore any gain adjustments received from the signal power calculator 5. Alternatively, the gain controller 6 may, on instruction from the speech activity detector 4 that no speech is contained in the signal, alter the gain to another predetermined value, for example set the gain to zero. However, the issue of 'comfort noise' is equally relevant in this embodiment as for the previous embodiment.

The signal is then passed to the speech encoder 7 and eventually to the transmitter 10 to be eventually transmitted onto the network as per the embodiment described above and shown in FIG. 1.

FIG. 3 shows a typical gain vs signal power relationship. For signal strengths up to threshold level 1 a gain of delta, a typical value may be 6 dB, is applied to the signal. Between the threshold level 1 and level 2 the gain applied is reduced linearly until the signal strength reaches threshold level 2 whereupon no further gain is applied. However, other gain vs signal power relationships may be chosen.

Figure 4:
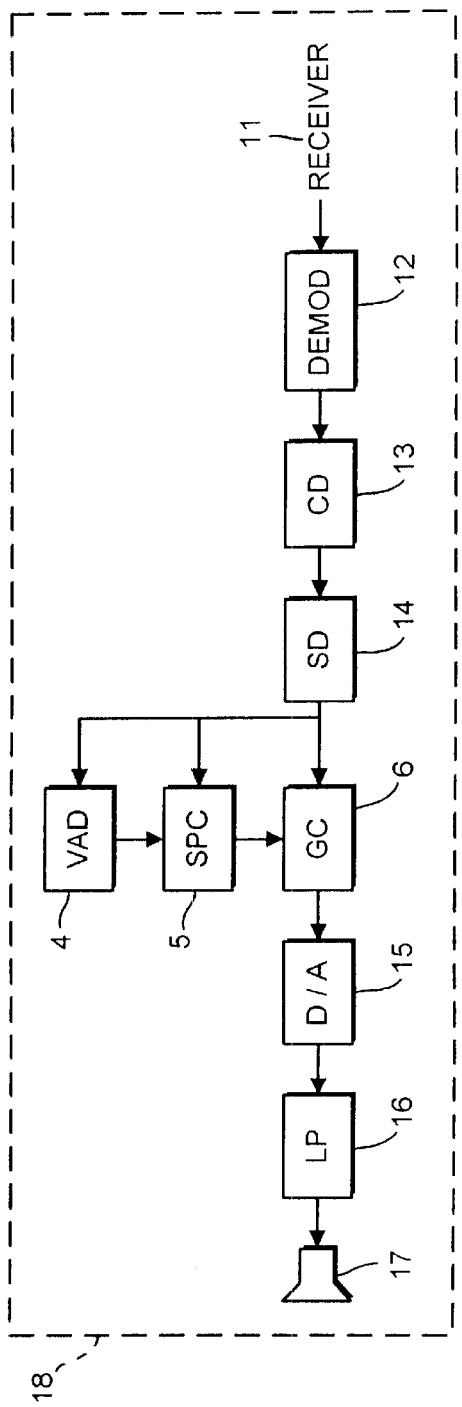
FIG. 4 is a schematic block diagram of a third embodiment of the automatic gain control apparatus.

FIG. 4 illustrates the use of this invention in a receive section of a mobile phone. This is basically the reverse of the embodiment shown in FIG. 1. The receiver 11 is coupled to a demodulator 12 which is coupled to a channel decoder 13. The channel decoder 13 is coupled to a speech decoder 14 which is coupled to a speech activity detector 4, a signal power calculator 5 and a gain controller 6. The speech activity detector 4 is coupled to the signal power calculator 5 which is coupled to the gain controller 6. The gain controller is coupled to a digital to analogue converter 15 which is coupled to a low pass filter 16. The low pass filter 16 is coupled to the speaker 17.

The receiver 11 receives the signal from the telecommunications network (not shown) and passes the received signal to the demodulator 12 which demodulates the speech signal from the carrier signal. The demodulated signal is then passed to the channel decoder 13 which performs error correction on the signal before passing the signal on the speech decoder 14 which decompresses the signal. The signal is then passed to the speech activity detector 4, the signal power calculator 5 and the gain controller 6. The gain of the signal is controlled by the gain controller 6 in an identical fashion to that described for FIG. 1. The signal is then passed to the digital to analogue converter 15 which converts the digital signal to analogue. The analogue signal is passed to a low pass filter, typically 4 kHz. The filter signal is then passed to the speaker.

Figure 5:
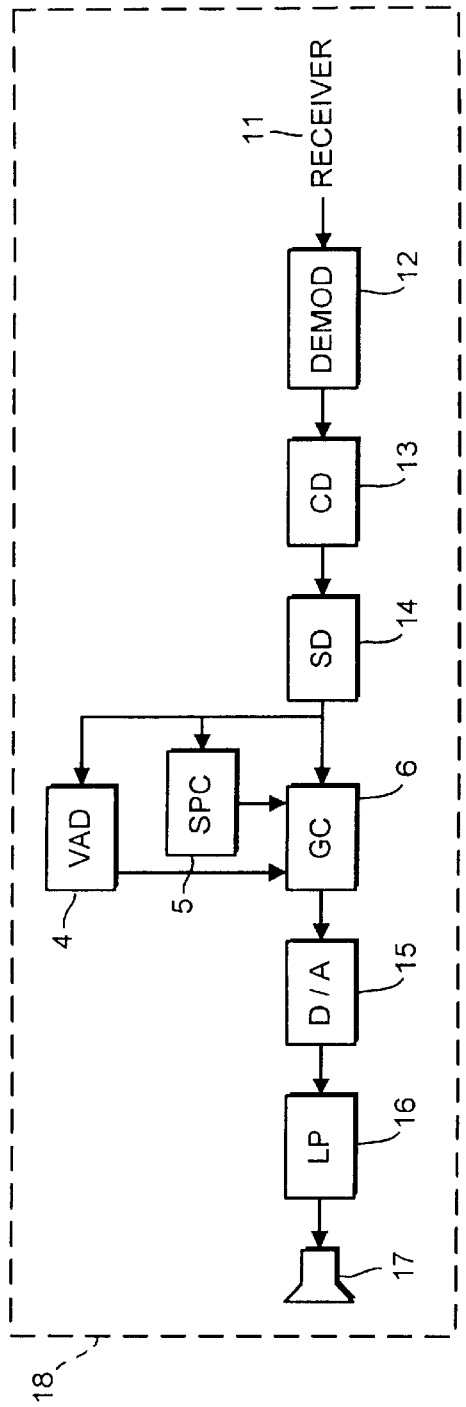
FIG. 5 is a schematic block diagram of a forth embodiment of the automatic gain control apparatus.

An alternative embodiment is shown in FIG. 5. In this embodiment the numbering of the elements is as for FIG. 4 where the gain control circuitry is as described in FIG. 2.

The present invention may include any novel feature or combination of features disclosed herein either explicitly or implicitly or any generalisation thereof irrespective of whether or not it relates to the presently claimed invention or mitigates any or all of the problems addressed. In view of the foregoing description it will be evident to a person skilled in the art that various modifications may be made within the scope of the invention. For example, it will be appreciated that the speech activity detector 4 and speech power calculator 5 may be combined in a noise suppression module as well as separate modules.

What is claimed is:

1. A gain control circuit for a telephone, the circuit comprising:

a signal strength calculator for calculating the strength of a digitized input signal and determining a gain to be applied to the signal in accordance with a predetermined criterion based on the strength of the signal;

a gain controller adapted to modify the strength of the digitized input signal by applying the gain to the signal;

a compression circuit adapted to compress the digitized input signal after the strength of the signal is modified; and a channel coder adapted to add bits to the modified signal to protect the modified signal from errors introduced during transmission of the signal.

2. A circuit according to claim 1, further comprising a speech activity detector for determining the presence and/or absence of speech, wherein the gain controller sets the gain applied to the signal to a predetermined level based on whether presence and/or absence of speech in the signal is detected.

3. A circuit according to claim 2, wherein the speech activity detector is coupled to the gain controller.

4. A circuit according to claim 2, wherein the speech activity detector is coupled to the signal strength calculator.

5. A circuit as claimed in claim 2, wherein the gain controller sets the gain applied to the signal to the predetermined level based on whether the level of speech in the signal falls below a predetermined threshold as calculated by the speech activity detector.

6. A circuit according to claim 5, wherein the predetermined level is the last gain value set by the gain controller before the speech level fell below the predetermined threshold.

7. A circuit according to claim 1, wherein the predetermined criterion is that the gain applied to the signal varies substantially linearly in relation to a change in the signal strength of the signal.

8. A method of controlling a gain of a telephone audio signal comprising the steps of:

determining if speech activity is present on the signal;

calculating a signal strength of the signal carrying speech activity;

modifying the strength of the signal wherein the strength of the audio signal is varied in accordance with a predetermined criterion based on the strength of the audio signal;

compressing the signal after the strength of the signal is modified; and adding extra bits to the signal after the signal is compressed to protect the signal from errors introduced during transmission.

* * * * *